United States Patent [19]
Takeuchi

[11] Patent Number: 5,822,567
[45] Date of Patent: Oct. 13, 1998

[54] METHOD OF AND APPARATUS FOR SIMULATING INTEGRATED CIRCUIT

[75] Inventor: Noriko Takeuchi, Kanagawa-ken, Japan

[73] Assignee: Kabushiki Kaisha Toshiba, Kawasaki, Japan

[21] Appl. No.: 516,280

[22] Filed: Aug. 17, 1995

[30] Foreign Application Priority Data

Aug. 18, 1994 [JP] Japan .................................. 6-194028

[51] Int. Cl.⁶ .................................................. G06F 17/00
[52] U.S. Cl. .......................................... 395/500; 364/578
[58] Field of Search ........................... 395/500; 364/578, 364/488–491

[56] References Cited

U.S. PATENT DOCUMENTS

| | | | |
|---|---|---|---|
| 4,792,913 | 12/1988 | Buckland et al. ....................... | 364/602 |
| 4,985,860 | 1/1991 | Vlach ....................................... | 364/578 |
| 5,105,373 | 4/1992 | Rumsey et al. .......................... | 364/578 |
| 5,481,484 | 1/1996 | Ogawa et al. ........................... | 364/578 |

OTHER PUBLICATIONS

"Simulation Techniques for Mixed Analog/Digital Circuits" Acona, IEEE Journal Solid State Circuits, Apr. 2, 1990, pp. 353–363.

"A mixed mode simulator for Digital/Analog VLSI Circuits . . . ", Young–Hyun et al, 1991 IEEE, pp. 2383–2386.

"Mixed Mode Circuit Simulator SPLIT2.1" Nishigaki et al, 1994 IEEE pp. 9–12.

Primary Examiner—Kevin J. Teska
Assistant Examiner—A. S. Roberts
Attorney, Agent, or Firm—Foley & Lardner

[57] ABSTRACT

A simulator speedily simulates an integrated circuit. The simulator has a digital simulator for simulating a digital part of the integrated circuit in each of sections divided from a total simulation time, an analog simulator for simulating an analog part of the integrated circuit in each of the sections, and a controller for controlling the digital and analog simulators. The controller determines for each of the sections whether or not the analog part must be simulated in the section and omits the simulation of the analog part in the section if it is determined not to simulate the analog part in the section.

7 Claims, 10 Drawing Sheets

METHOD OF AND APPARATUS FOR SIMULATING INTEGRATED CIRCUIT

BACKGROUND OF THE INVENTION

1. Field of the Invention

The present invention relates to a method of and an apparatus for simulating an integrated circuit having an analog part and a digital part.

2. Description of the Related Art

A simulator for simulating the operation of a large-scale integrated circuit has a function of simulating a digital part of the integrated circuit and a function of simulating an analog part thereof.

Figure 1:
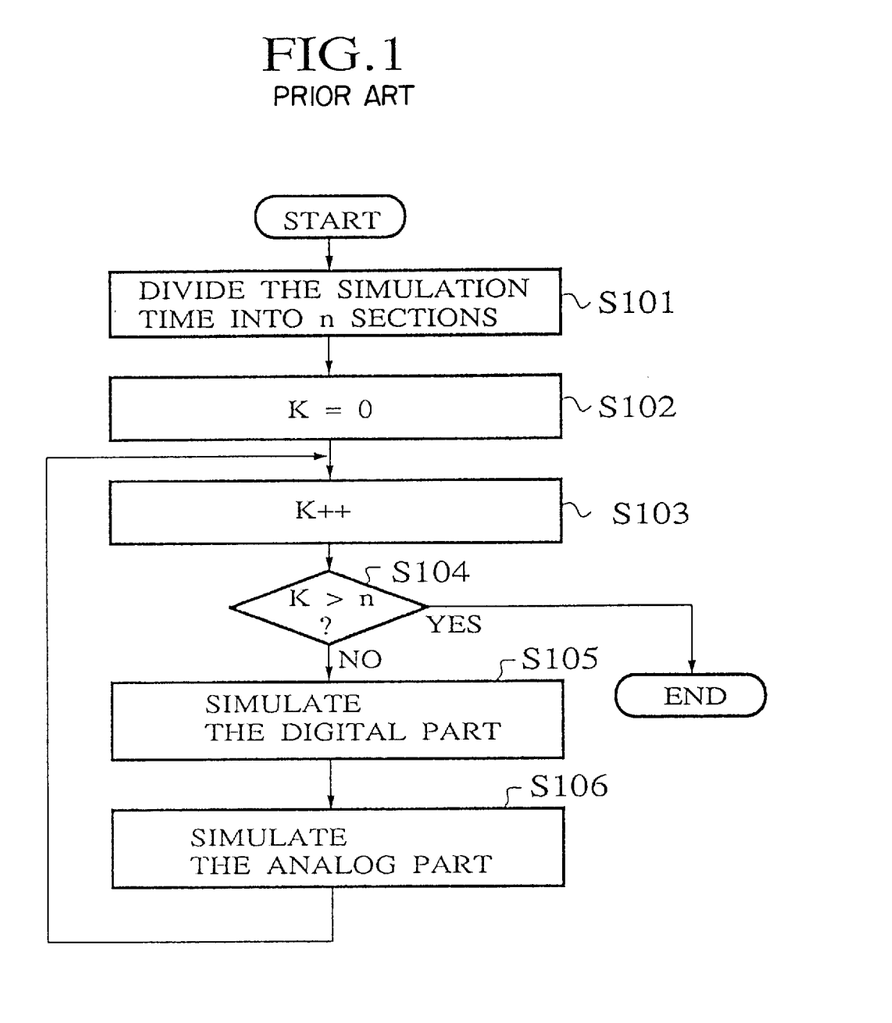
FIG. 1 is a flowchart showing the operation of a simulator according to a prior art.
Figure 2:
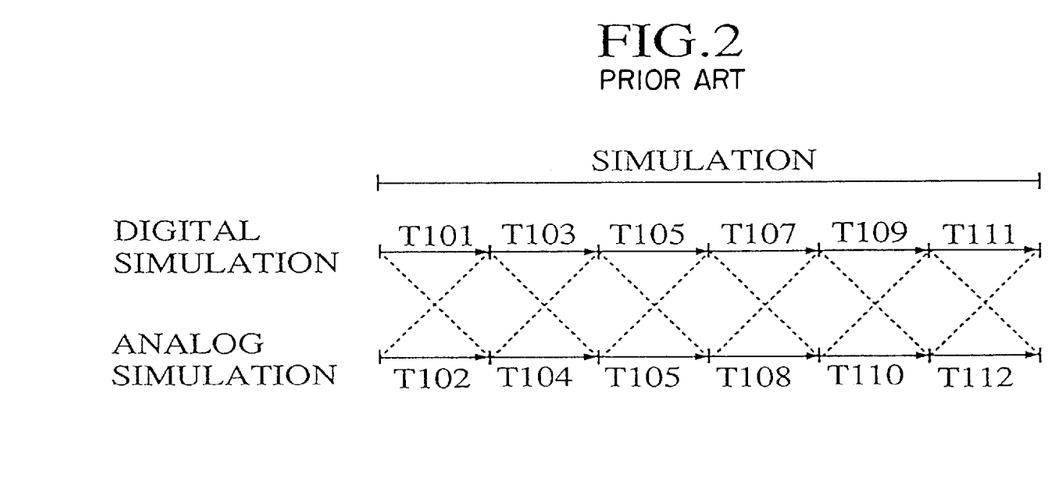
FIG. 2 schematically shows the operation of the simulator of FIG. 1.

FIG. 1 is a flowchart showing the operation of the simulator for simulating a large-scale integrated circuit. Step S101 divides a total simulation time into n sections. Steps S102 through S106 simulate the digital and analog parts of the integrated circuit alternately in each of the sections in order of, for example, T101 to T112 as shown in FIG. 2, and provides a simulation result.

The simulator simulates the operation of the integrated circuit in all of the sections even in a section where the integrated circuit produces no signal. This is a waste of time. In particular, when the analog part of the integrated circuit produces no signal in some section, it is quite useless to simulate the analog part in the section because it takes a long time to simulate the analog part.

SUMMARY OF THE INVENTION

An object of the present invention is to provide a simulator for speedily simulating an integrated circuit even if the operation of the integrated circuit is unknown beforehand.

Another object of the present invention is to provide a method of and apparatus for speedily simulating an integrated circuit whose operation is roughly known in advance.

In order to accomplish the objects, the present invention provides a simulator for simulating the operation of an integrated circuit, having a digital simulator for simulating a digital part of the integrated circuit in each of sections equally divided from a total simulation time, an analog simulator for simulating an analog part of the integrated circuit in each of the sections, and a controller for controlling the digital and analog simulators. The controller determines for each of the sections whether or not the analog part must be simulated in the section, and if it is determined not to simulate the analog part in the section, omits the simulation of the analog part in the section.

The controller may omit the simulation of the analog part in a section if the voltage of every node of the analog part shows no inclination before simulating the analog part in the section and if the levels of signals passed from the digital part to the analog part in the section are unchanged before and after the simulation of the digital part in the section.

The present invention also provides a simulator for simulating the operation of an integrated circuit, having a digital simulator for simulating a digital part of the integrated circuit in each of sections equally divided from a total simulation time, an analog simulator for simulating an analog part of the integrated circuit in each of the sections, a table for storing analog-simulation-time information that indicates for each of the sections whether or not the analog part must be simulated in the section, and a controller for controlling the digital and analog simulators. The controller refers to the table to determine for each of the sections whether or not the analog part must be simulated in the section, and if the table indicates not to simulate the analog part in the section, omits the simulation of the analog part in the section.

The simulator may have a plurality of the tables for storing simulation time information for the different numbers of sections divided from a simulation time.

The present invention also provides a method of simulating the operation of an integrated circuit, including the steps of (a) simulating a digital part of the integrated circuit in each of sections divided from a total simulation time, (b) determining for each of the sections in which the digital part has just been simulated whether or not an analog part of the integrated circuit must be simulated in the section, (c) simulating the analog part in the section if it is determined to simulate the analog part in the section, and (d) omitting the simulation of the analog part in the section if it is determined not to simulate the analog part in the section. The step (a) is repeated on each of the sections.

The step (b) may determine not to simulate the analog part in the section if the voltage of every node of the analog part shows no inclination before the simulation of the analog part in the section and if the levels of signals passed from the digital part to the analog part in the section are unchanged before and after the simulation of the digital part in the section.

The step (b) may determine whether or not the analog part must be simulated in the section according to a table for preliminarily storing analog-simulation-time information.

DETAILED DESCRIPTION OF THE EMBODIMENTS

Figure 3:
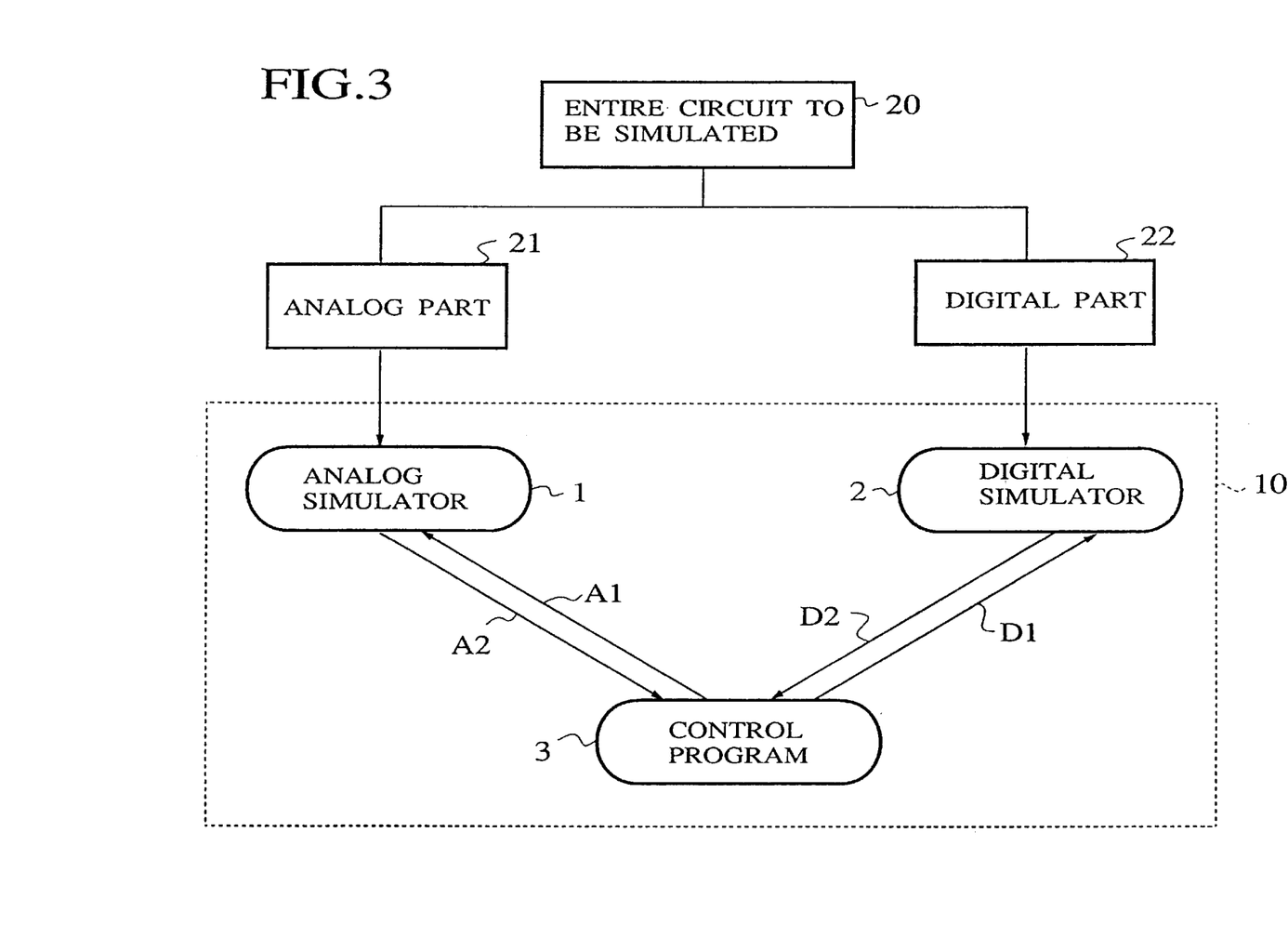
FIG. 3 is a block diagram showing a simulator according to a first embodiment of the present invention and an integrated circuit simulated by the simulator.

The embodiments of the present invention will be explained with reference to the drawings. FIG. 3 is a block diagram showing a simulator according to a first embodiment of the present invention and an integrated circuit simulated by the simulator.

The simulator 10 has an analog simulator 1 for simulating an analog part 21 of the integrated circuit 20, a digital simulator 2 for simulating a digital part 22 of the integrated circuit 20, and a control program 3 for controlling the operations of the analog and digital simulators 1 and 2.

The control program 3 is stored in, for example, a ROM and executed by a microprocessor (not shown). The control program 3 issues a simulation instruction A1 to the analog simulator 1 and a simulation instruction D1 to the digital simulator 2, to control the simulators 1 and 2 according to the flowchart of FIG. 4. When completing the simulations, the simulators 1 and 2 provide the control program 3 with completion signals A2 and D2. Then, the control program 3 carries out the next simulations or terminates the operation.

The operation of the analog part 21 of the integrated circuit 20 is not known. The analog simulator 1 is connected to all nodes of the analog part 21, and the digital simulator 2 is connected to all nodes of the digital part 22.

Figure 4:
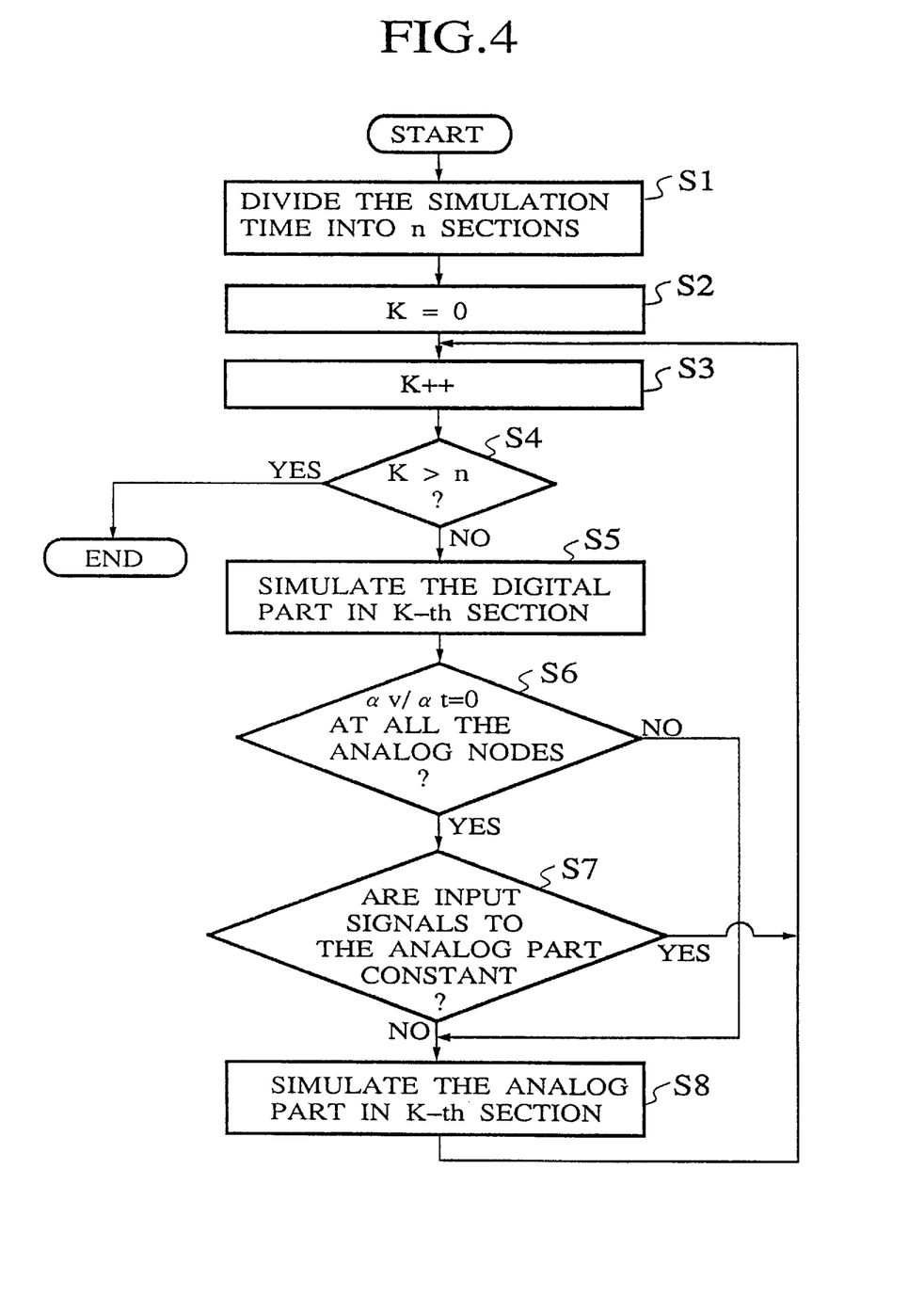
FIG. 4 is a flowchart showing the operation of the simulator of FIG. 3.
Figure 5:
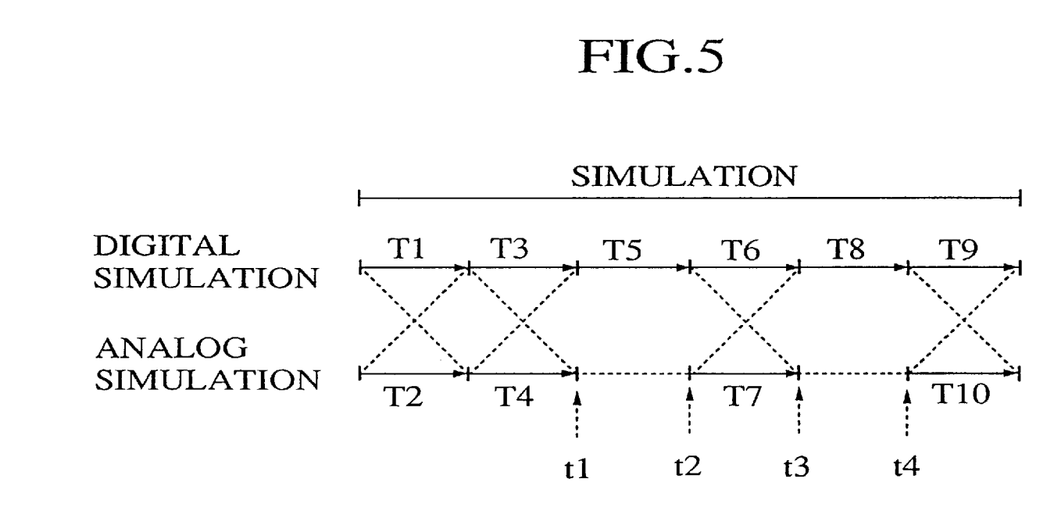
FIG. 5 schematically shows the operation of the simulator of FIG. 3.

The operation of the simulator 10 will be explained with reference to FIGS. 4 and 5, in which FIG. 4 is a flowchart showing the operation and FIG. 5 is a schematic view showing the operation.

Step S1 of FIG. 4 divides a total simulation time into n sections, so that the integrated circuit 20 is simulated in each of the sections one after another.

Step S2 initializes a target section K to O. Step S3 increments the target section K by one.

Step S4 tests if K>n. If it is not K>n, step S5 simulates the digital part 22 of the integrated circuit 20 in the target section K. Steps 6 and 7 determine whether or not the analog part 21 of the integrated circuit 20 must be simulated in the target section K.

More precisely, the step S6 determines whether or not the voltage of every node of the analog part 21 shows no inclination at the start of the target section K, i.e., whether or not the analog part 21 has a factor to change. The step S7 determines if the levels of signals passed from the digital part 22 to the analog part 21 in the target section K are unchanged before and after the simulation of the digital part 22 in the target section K. Namely, this step compares the levels of the signals before and after the simulation of the digital part 22 in the target section K by storing the signal levels in a memory.

If any one of the steps S6 and S7 provides a negative answer, step S8 simulates the analog part 21 in the target section K. When both the steps S6 and S7 provide an affirmative answer, the simulation of the analog part 21 in the target section K is omitted, and the flow returns to the step S3. The step S3 increments the target section K by one and repeats the steps mentioned above.

FIG. 5 shows an example of the operation of the simulator 10. A total simulation time is uniformly divided into six sections. Before simulating the analog part 21 of the integrated circuit 20 in the target section K, the steps S6 and S7 determine whether or not the analog part 21 must be simulated in the target section K.

In FIG. 5, the steps S6 and S7 provide each an affirmative answer in the third section (t1 to t2) and fifth section (t3 to t4), so that the simulation of the analog part 21 in each of these sections is omitted. More precisely, the simulations are carried out in order of digital simulation T1, analog simulation T2, digital simulation T3, analog simulation T4, digital simulation T5, digital simulation T6, analog simulation T7, digital simulation T8, digital simulation T9, and analog simulation T10.

In this way, the first embodiment automatically determines in each of the sections whether or not the analog part 21 of the integrated circuit 20 must be simulated. The first embodiment, therefore, is capable of shortening a simulation time even if the operation of an integrate circuit to be simulated is not known in advance.

Figure 6:
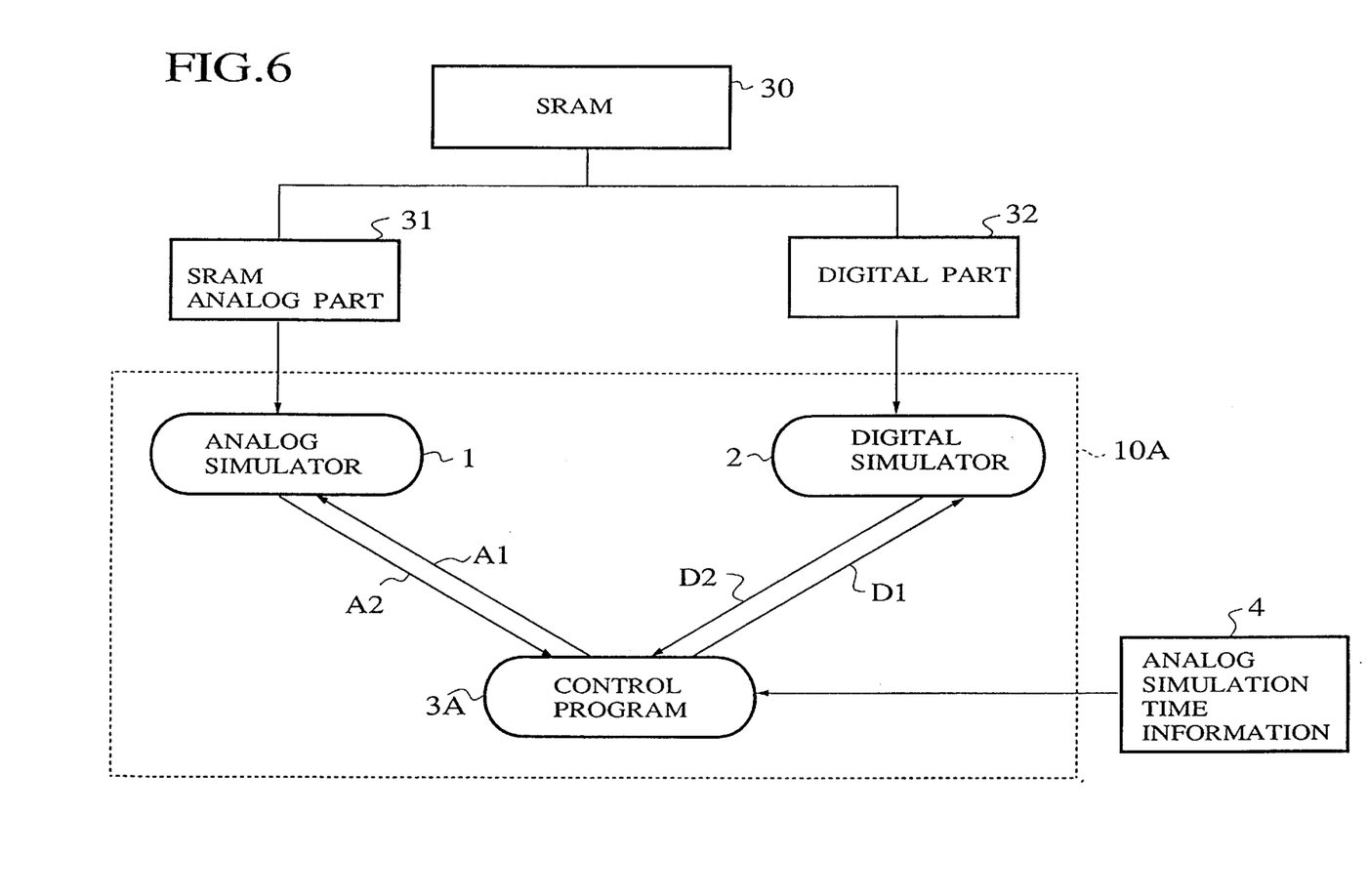
FIG. 6 is a block diagram showing a simulator according to a second embodiment of the present invention and an integrated circuit simulated by the simulator.

FIG. 6 is a block diagram showing a simulator according to the second embodiment of the present invention, and an integrated circuit simulated by the simulator.

In the second embodiment, the operation of an analog part of the integrated circuit is known beforehand.

Figure 8:
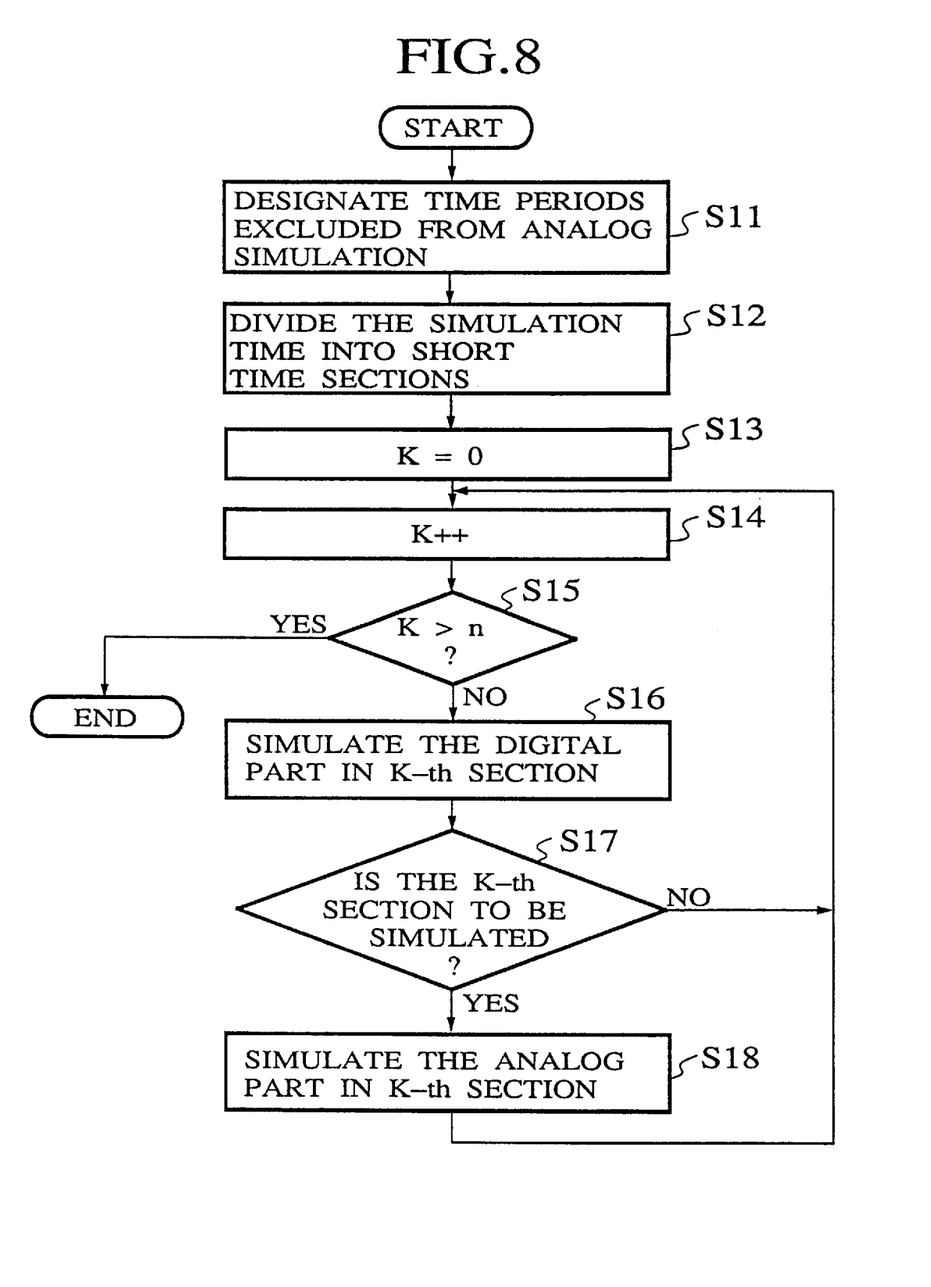
FIG. 8 is a flowchart showing the operation of the simulator of FIG. 6.

The simulator 10A has an analog simulator 1, a digital simulator 2, and a control program 3A for controlling the operations of the simulators 1 and 2 as shown in the flowchart of FIG. 8. The control program 3A refers to a table 4 for storing analog-simulation-time information that indicates every section in which the analog part 31 of the integrated circuit requires no simulation.

The integrated circuit to be simulated is a static RAM (SRAM) 30. All nodes of the analog part 31 of the SRAM 30 are connected to the analog simulator 1, and all nodes of a digital part 32 of the SRAM 30 are connected to the digital simulator 2.

The table 4 contains one or more pairs of a starting time and a terminating time between which the analog part 31 need not be simulated. The control program 3 recognizes the starting time and the terminating time of the section currently simulated and judges whether or not the analog part 31 must be simulated in the section according to whether or not the current section includes a starting time or a terminating time contained in the table 4 or is located between the starting time and the terminating time of any pair.

Figure 7:
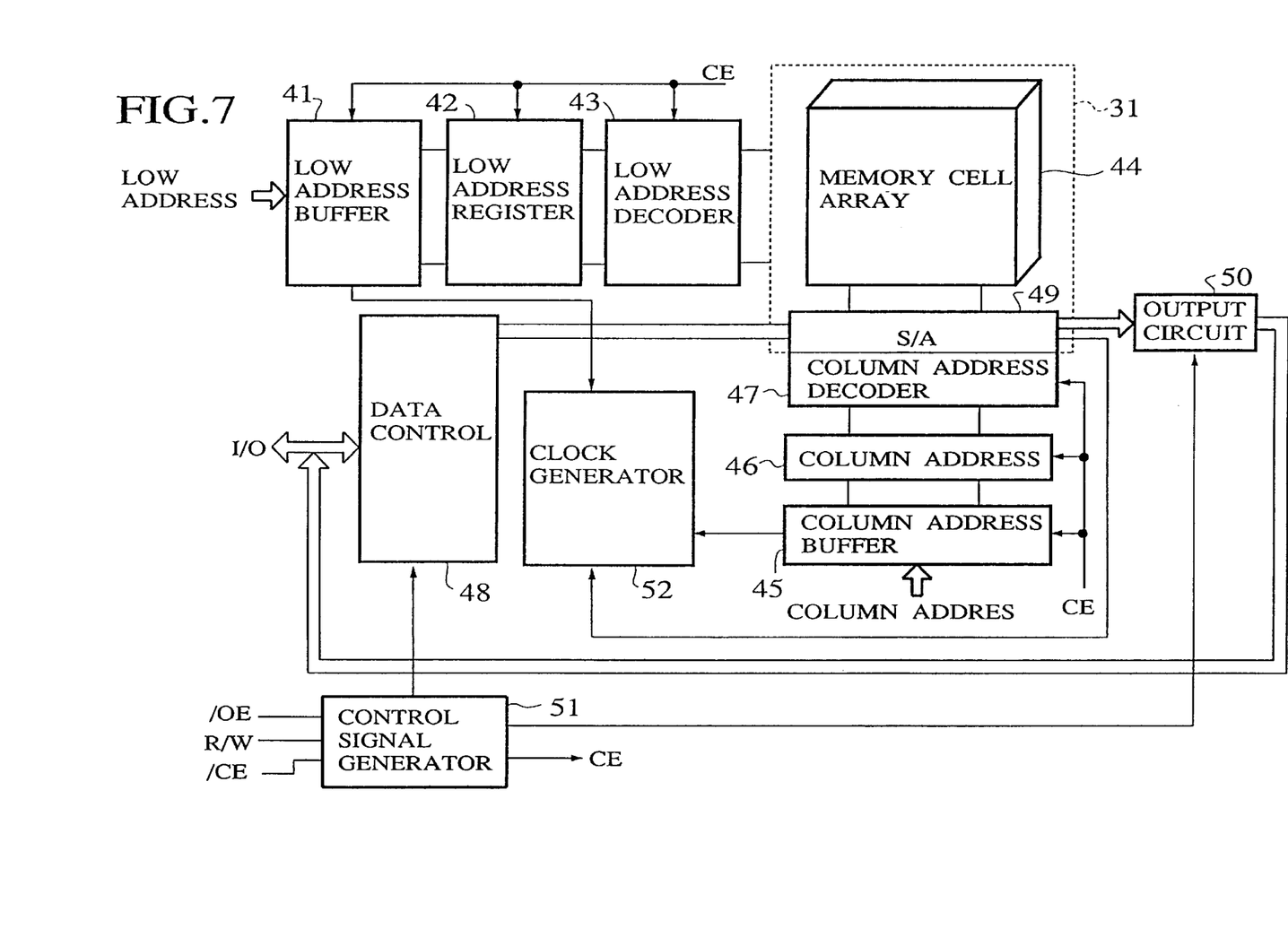
FIG. 7 is a block diagram showing an SRAM 30 simulated by the simulator of FIG. 6.

FIG. 7 is a block diagram showing the structure of the SRAM 30 to be simulated.

The SRAM 30 has a row address buffer 41 for receiving a row address, a row address register 42, and a row address decoder 43. These elements 41 to 43 are cascaded and connected to the rows of a memory cell array 44 for storing data. The SRAM 30 further has a column address buffer 45 for receiving a column address, a column address register 46, and a column address decoder 47. These elements 45 to 47 are cascaded and connected to the columns of the memory cell array 44.

To write data into the memory cell array 44, a row address and column address are provided to specify a memory cell in the array 44, and data is written into the specified cell through an I/O port, a data controller 48, and a sense amplifier 49.

To read data out of the memory cell array 44, a row address and a column address are provided to specify a memory cell in the array 44, and data in the specified cell is transferred to the I/O port through the sense amplifier 49 and an output circuit 50.

A signal generator 51 generates a control signal for controlling the data controller 48 and a chip enable signal CE used to specify an address. A clock generator 52 generates a clock signal.

The analog part 31 of the SRAM 30 includes the memory cell array 44 and sense amplifier 49, and the digital part 32 thereof includes the other elements.

Figure 9:
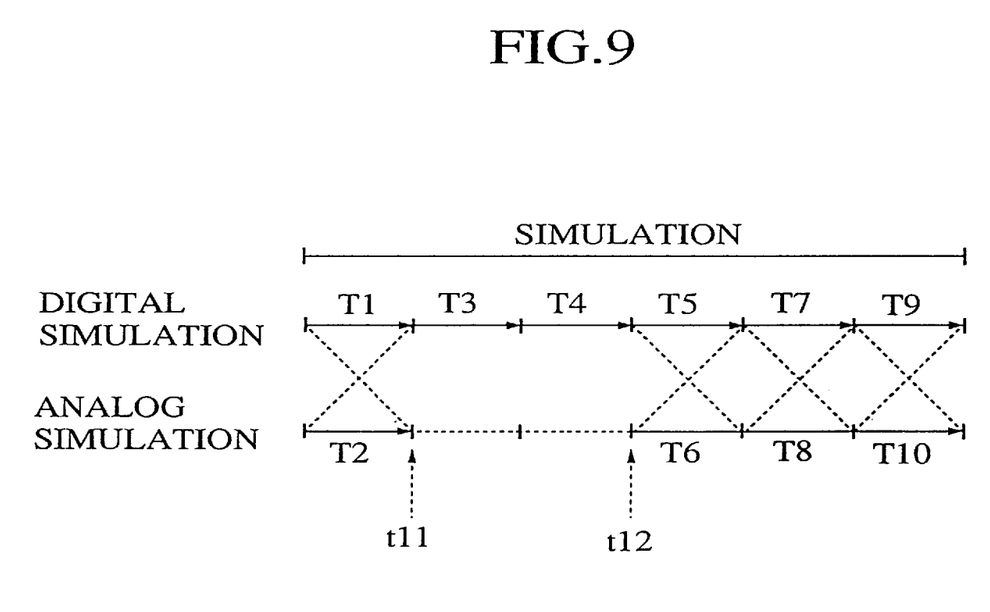
FIG. 9 schematically shows the operation of the simulator of FIG. 6.

The operation of the second embodiment will be explained with reference to FIGS. 8 and 9, in which FIG. 8 is a flowchart showing the operation and FIG. 9 is a schematic view showing the operation.

Step S11 of FIG. 8 reads from the table 4 one or more pairs of a starting time and a terminating time between which the analog part 31 need not be simulated. Step S12 divides a total simulation time into n sections. Thereafter, simulations are carried out in the sections sequentially.

Steps S13 to S16 are the same as the steps S2 to S5 of FIG. 4. The step S16 simulates the digital part 32 of the SRAM 30 in a target section K. Step S17 determines whether or not the analog part 31 must be simulated in the section according to whether or not the current target section includes a starting time or a terminating time contained in the table 4 or is located between the starting time and the terminating time of any pair.

If the step S17 provides an affirmative answer (YES), step S18 simulates the analog part 31 in the target section K. If the step S17 provides a negative answer (NO), the flow returns to the step S14 without simulating the analog part 31 in the target section K.

In FIG. 9, it is determined that the analog part 31 is not simulated in the second and third sections (t11 to t12). Namely, simulations are carried out in order of digital simulation T1, analog simulation T2, digital simulation T3, digital simulation T4, digital simulation T5, analog simulation T6, digital simulation T7, analog simulation T8, digital simulation T9, and analog simulation T10.

It may be known in advance that th analog part 31 is simulated in the first half of a simulation time. In this case, the table 4 specifies only a starting time from which the analog part 31 need not be simulated, and the control program 3A is programmed to skip the steps S17 and S18 once the starting time is attained.

The second embodiment specifies one or more periods in which the analog part 31 is not simulated. On the contrary, it is possible to specify a period in which the analog part 31 is simulated as shown in FIG. 10.

Figure 10:
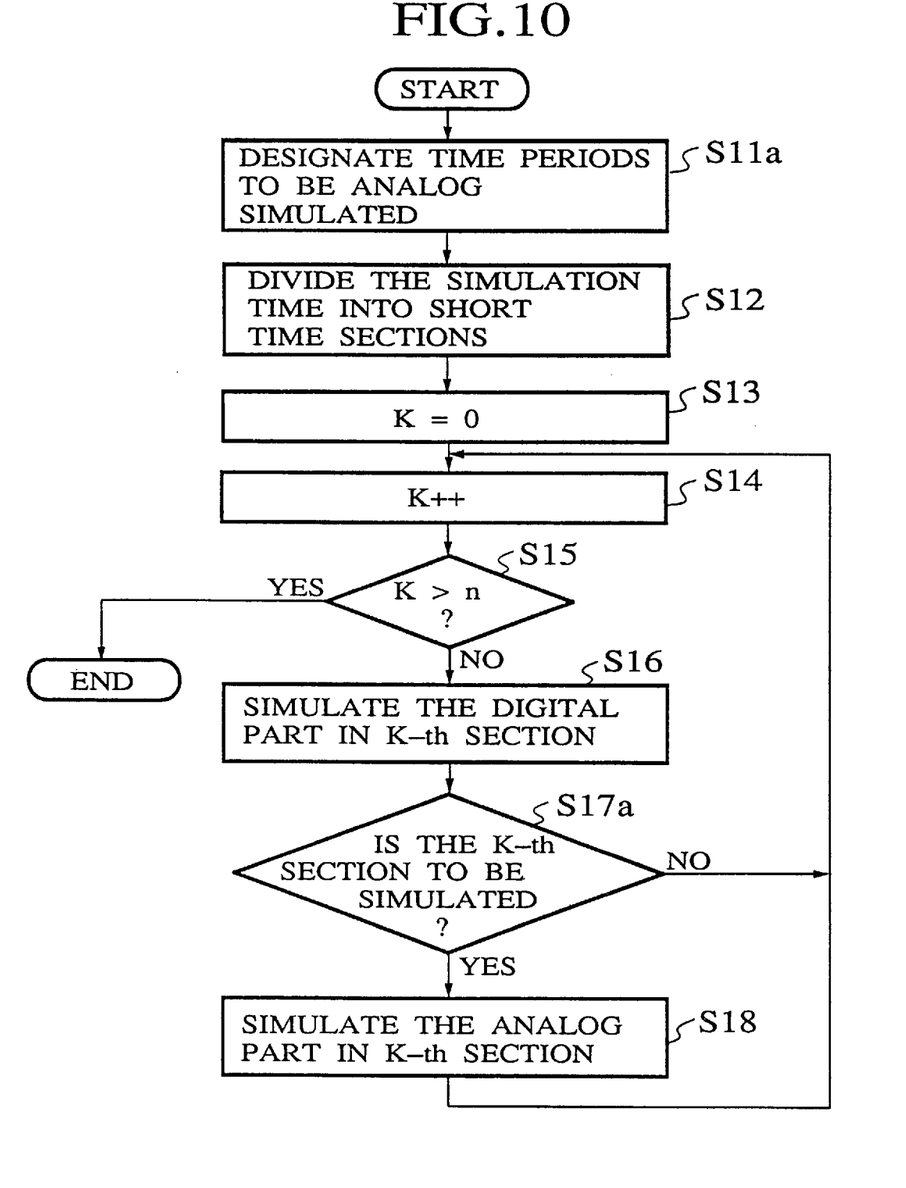
FIG. 10 is a flowchart showing the operation of a modification of the second embodiment of the present invention.

FIG. 10 is a flowchart showing the operation of a modification of the second embodiment.

The modification has steps S11a and S17a instead of the steps S11 and S17 of FIG. 8. Unlike the step S11 that specifies time periods in which the analog part 31 of the SRAM 30 is not simulated, the step S11a specifies time periods in which simulation of the analog part 31 is necessary, according to a table 4 storing analog-simulation-time information. In this case, the table 4 contains one or more pairs of a starting time and a terminating time between which the analog part 31 must be simulated. The step S17a determines whether or not a current target section K must simulate the analog part 31 according to whether or not the current section includes a starting time or a terminating time contained in the table 4 or is located between the starting time and the terminating time of any pair.

If the step S17a provides an affirmative answer (YES), step S18 simulates the analog part 31 in the target section K. If the step S17a provides a negative answer (NO), the analog part 31 is not simulated in the target section K, and the flow returns to the step S14 to select the next section.

It may be known in advance that the analog part 31 is simulated in the second half of a simulation time. In this case, the table 4 specifies only a starting time from which the analog part 31 must be simulated, and the control program 3A is programmed to skip the step S17a once the starting time is attained.

What is claimed is:

1. A simulator for simulating the operation of an integrated circuit, comprising:

a digital simulator for simulating a digital part of the integrated circuit in each of sections equally divided from a total simulation time;

an analog simulator for simulating an analog part of the integrated circuit in each of the sections; and control means for controlling said digital and analog simulators, determining for each of the sections whether or not the analog part must be simulated in the section, and omitting the simulation of the analog part in the section if it is determined not to simulate the analog part in the section.

2. The simulator according to claim 1, wherein said control means omits the simulation of the analog part in a given one of the sections if the voltage of every node of the analog part shows no inclination before simulating the analog part in the section and if the levels of signals passed from the digital part to the analog part in the section are unchanged before and after the simulation of the digital part in the section.

3. A simulator for simulating the operation of an integrated circuit, comprising:

a digital simulator for simulating a digital part of the integrated circuit in each of sections equally divided from a total simulation time;

an analog simulator for simulating an analog part of the integrated circuit in each of the sections;

a table for storing analog-simulation-time information that indicates at least one time period for which the analog part must be simulated; and control means for controlling said digital and analog simulators, referring to the table to determine for each of the sections whether or not the analog part must be simulated in the section, and omitting the simulation of the analog part in the section if the table indicates not to simulate the analog part in the section.

4. The simulator according to claim 3, comprising a plurality of said tables for storing analog-simulation-time information for the different numbers of sections divided from the simulation time.

5. A method of simulating the operation of an integrated circuit, comprising the steps of:

(a) simulating a digital part of the integrated circuit in each of sections equally divided from a total simulation time;

(b) determining for a given one of the sections in which the digital part has just been simulated whether or not an analog part of the integrated circuit must be simulated in the section;

(c) simulating the analog part in the section if it is determined to simulate the analog part in the section; and (d) omitting the simulation of the analog part in the section if it is determined not to simulate the analog part in the section, said step (a) being repeated on each of the sections.

6. The method according to claim 5, wherein said step (b) determines not to simulate the analog part in the section if the voltage of every node of the analog part shows no inclination before the simulation of the analog part in the section and if the levels of signals passed from the digital part to the analog part in the section are unchanged before and after the simulation of the digital part in the section.

7. The method according to claim 5, wherein said step (b) determines whether or not the analog part must be simulated in the section according to a table that stores analog-simulation-time information in advance.

* * * * *